US009559719B1

(12) United States Patent
Kauffman et al.

(10) Patent No.: US 9,559,719 B1
(45) Date of Patent: Jan. 31, 2017

(54) SINGLE AMPLIFER BI-QUAD SIGMA-DELTA MODULATOR

(71) Applicant: Intel IP Corporation, Santa Clara, CA (US)

(72) Inventors: John G. Kauffman, Munich (DE); Udo Schuetz, Munich (DE)

(73) Assignee: Intel IP Corporation, Santa Clara, CA (US)

(*) Notice: Subject to any disclaimer, the term of this patent is extended or adjusted under 35 U.S.C. 154(b) by 0 days.

(21) Appl. No.: 14/977,341

(22) Filed: Dec. 21, 2015

(51) Int. Cl.
*H03M 3/00* (2006.01)

(52) U.S. Cl.
CPC ............. *H03M 3/344* (2013.01); *H03M 3/30* (2013.01); *H03M 3/32* (2013.01); *H03M 3/386* (2013.01); *H03M 3/464* (2013.01)

(58) Field of Classification Search
CPC ........ H03M 3/344; H03M 3/464; H03M 3/32; H03M 3/30; H03M 3/386
USPC ................................................ 341/155, 143
See application file for complete search history.

(56) References Cited

U.S. PATENT DOCUMENTS

| | | | | |
|---|---|---|---|---|
| 5,408,235 A | * | 4/1995 | Doyle | ................ H03H 17/0251 341/120 |
| 7,786,911 B2 | * | 8/2010 | Joshi | .................... H04N 5/3745 341/118 |
| 8,344,921 B2 | * | 1/2013 | Lin | ......................... H03M 3/30 341/143 |
| 8,830,097 B2 | * | 9/2014 | Aruga | ..................... H03M 3/35 341/122 |

OTHER PUBLICATIONS

Mautsukawa, Kazuo, et al., "A Fifth-Order Continuous-Time Delta-Sigma Modulator With Single-Opamp Resonator", IEEE Journal of Solid-State Circuits, vol. 45, No. 4, (Apr. 1, 2010), 10 pgs.
Zanbaghi, Ramin, "An 80-dB DR, 7.2-MHz Bandwidth Single Opamp Biquad Based CT Modulator Dissipating 13.7-mW", IEEE Journal of Solid-State Circuits, vol. 48, No. 2, (Feb. 1, 2013), 15 pgs.
Zanbahi, Ramin, et al., "A Novel Low Power Hybrid Loop Filter for Continuous-Time Sigma-Delta Modulators", IEEE International Symposium on Circuits and Systems—ISCAS 2009, (May 1, 2009), 4 pgs.

* cited by examiner

*Primary Examiner* — Brian Young
(74) *Attorney, Agent, or Firm* — Schwegman Lundberg & Woessner, P.A.

(57) ABSTRACT

Some embodiments include apparatus and methods using a first stage including an integrator, a second stage coupled to the first stage, the second stage including an amplifier, a first capacitor, and a second capacitor coupled in series with the first capacitor between an input node and an output node of the amplifier, a quantizer coupled to the output node of the amplifier, and a feedback path coupled to an output node of the quantizer and to the first and second stages, the feedback path including a digital-to-analog converter (DAC), the DAC including an input node coupled to the output node of the quantizer and an output node coupled to the input node of the amplifier.

23 Claims, 16 Drawing Sheets

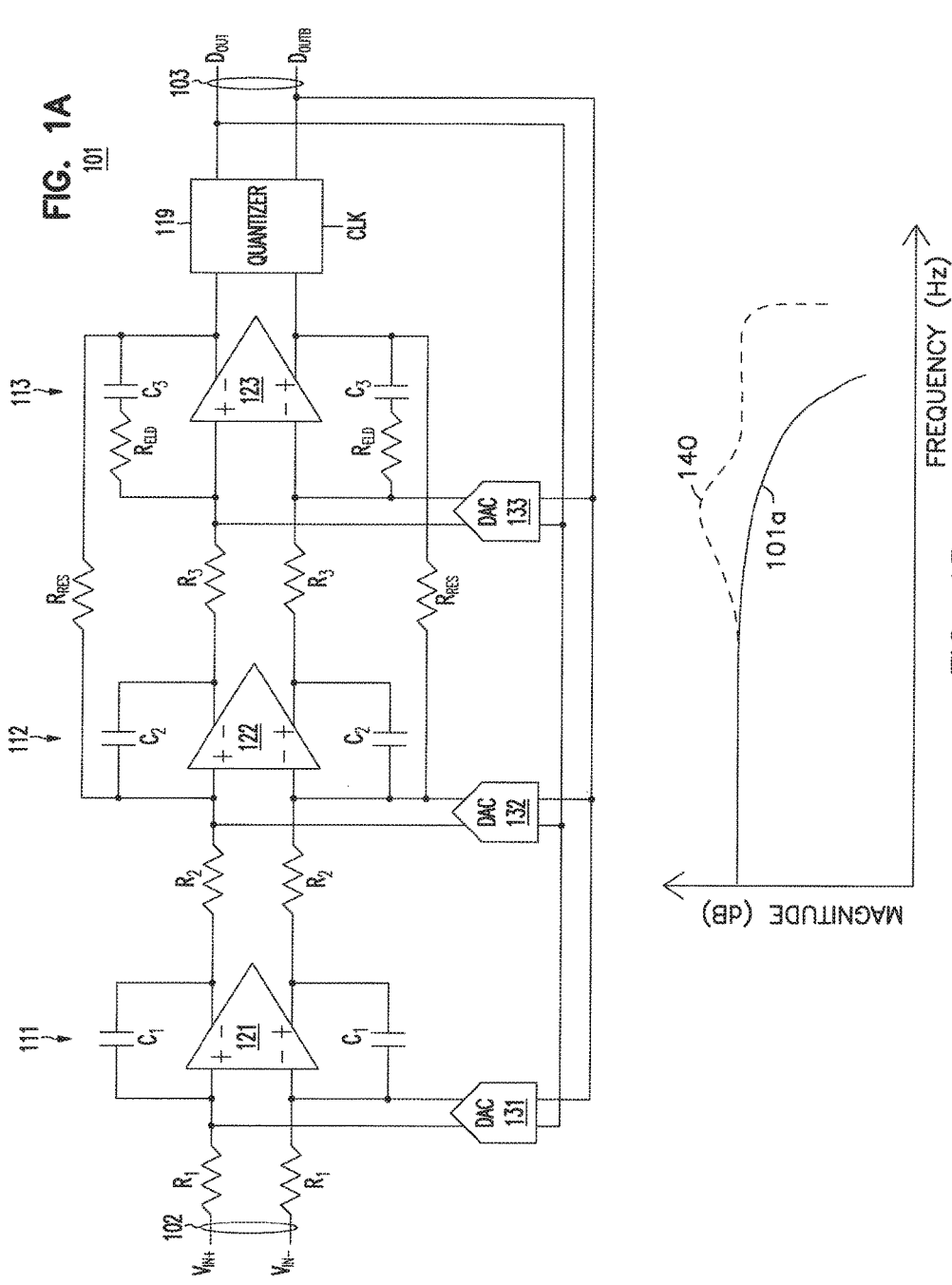

201A

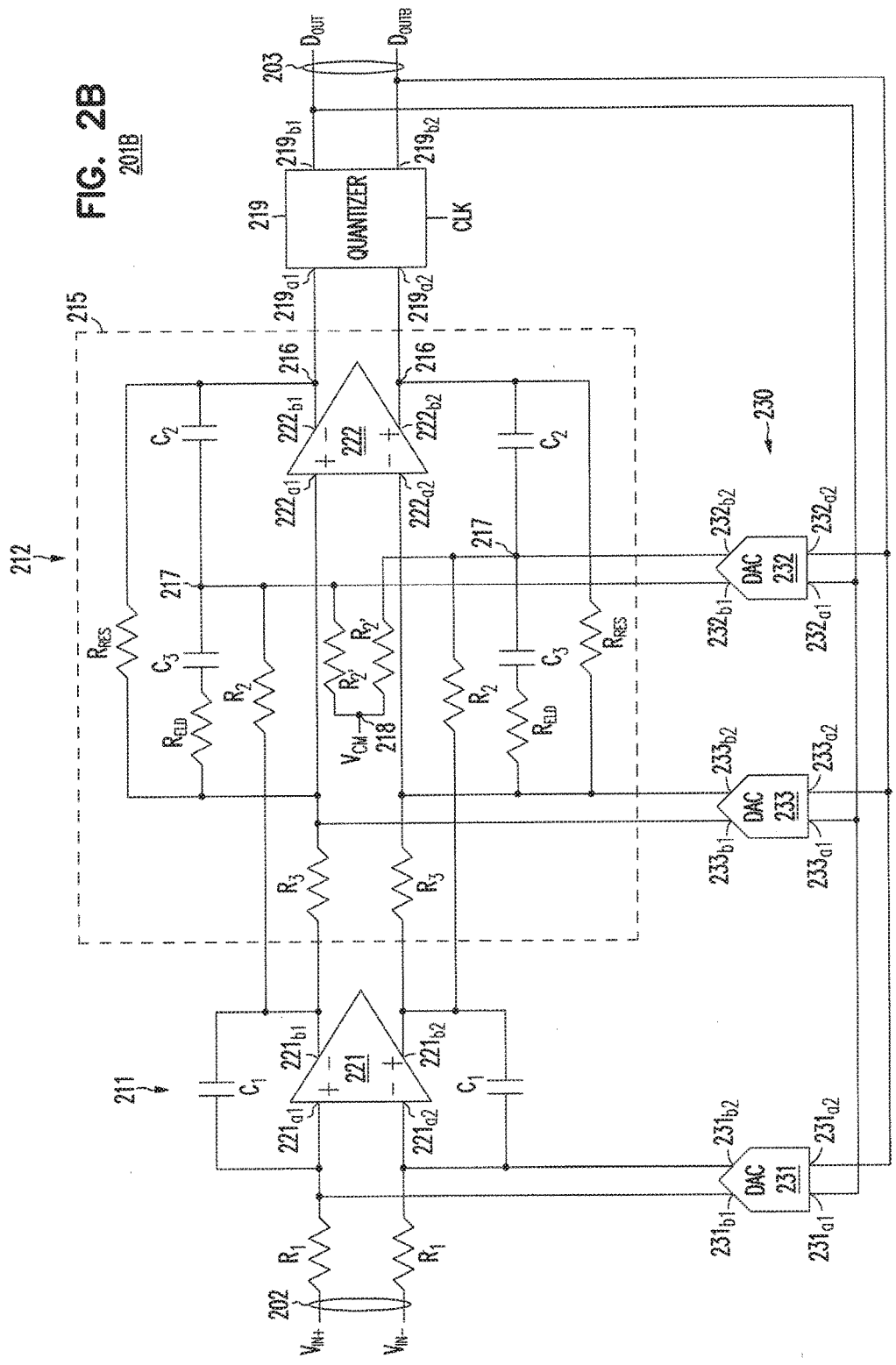

201F

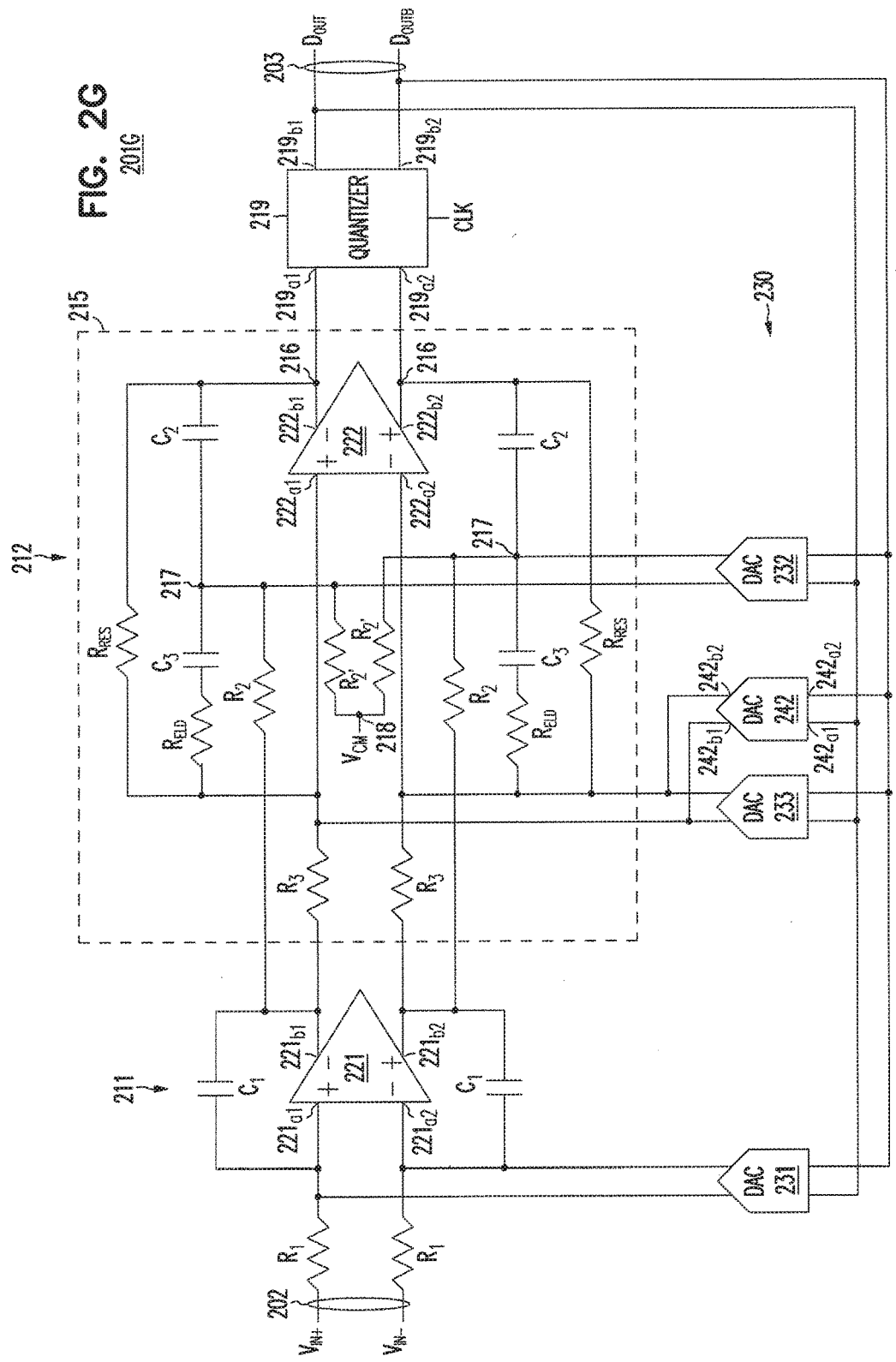

201H

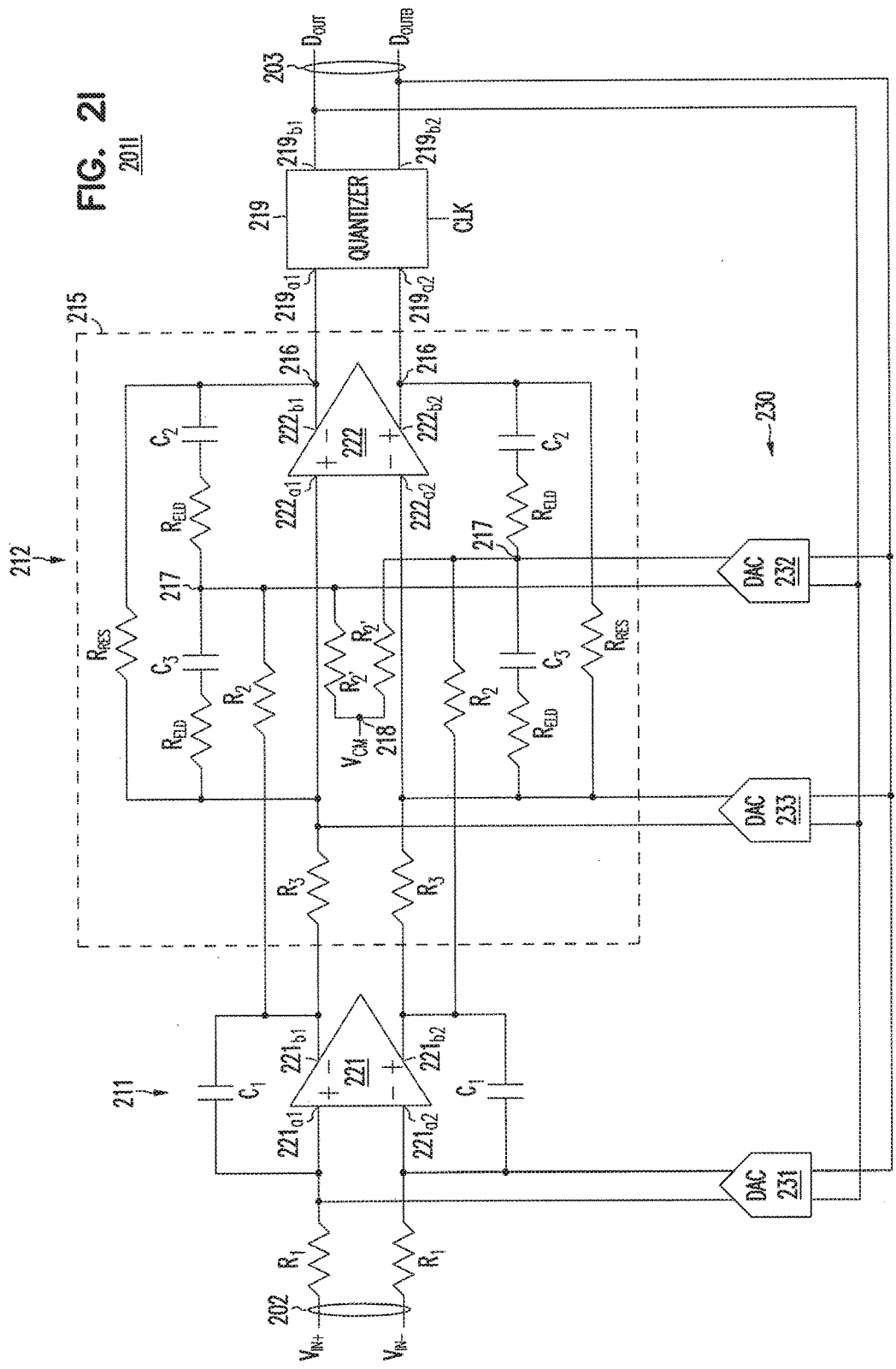

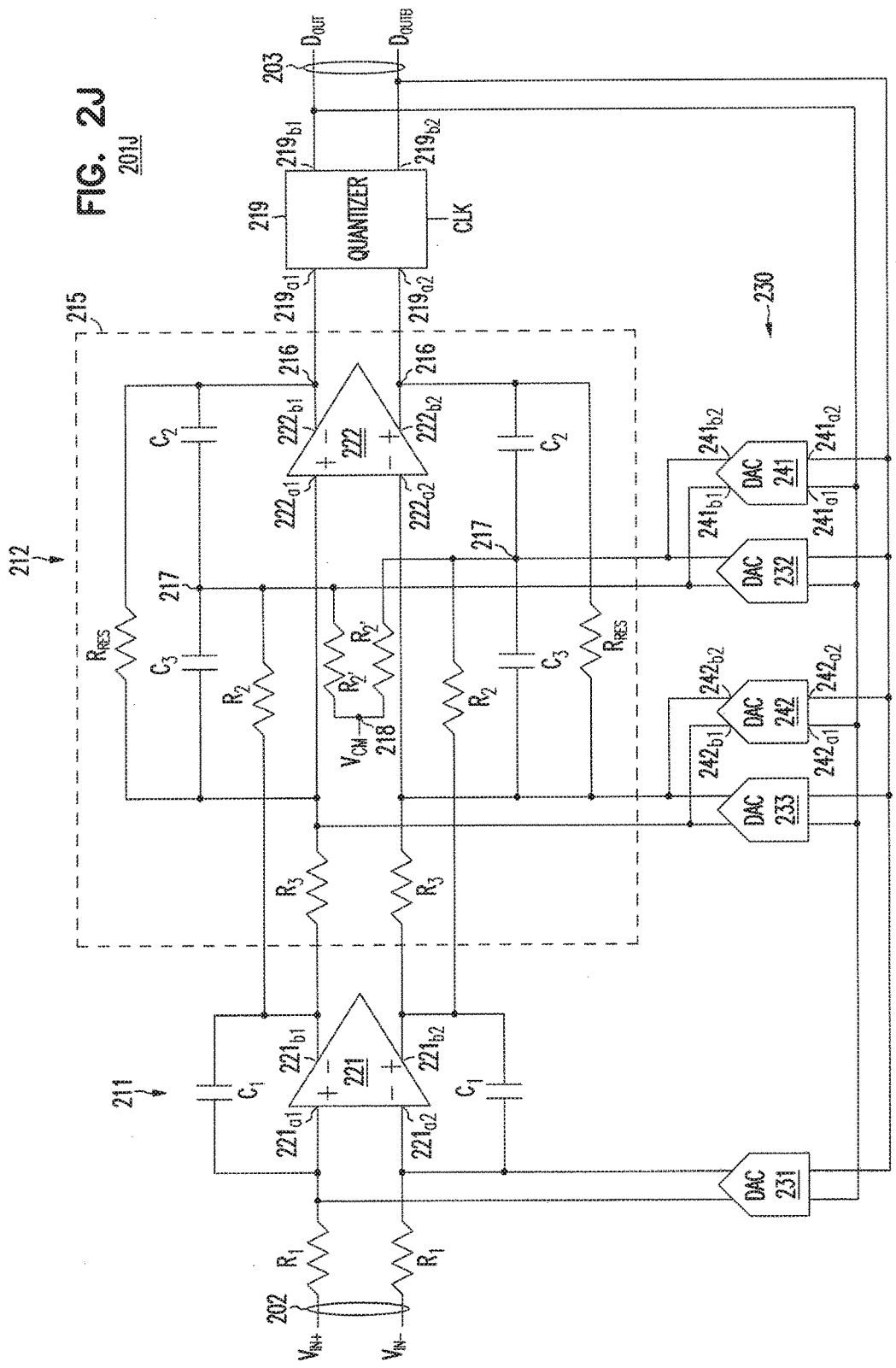

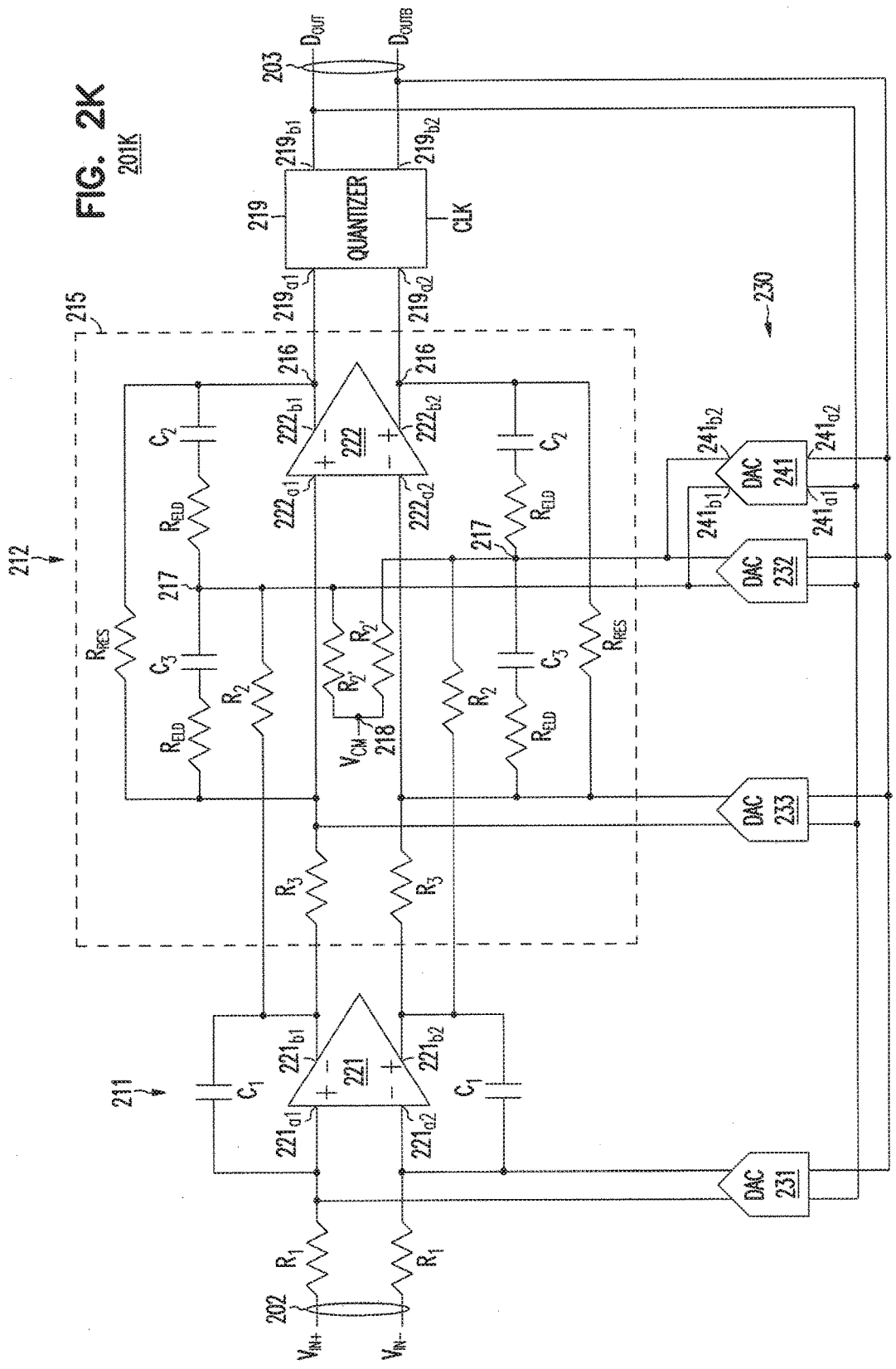

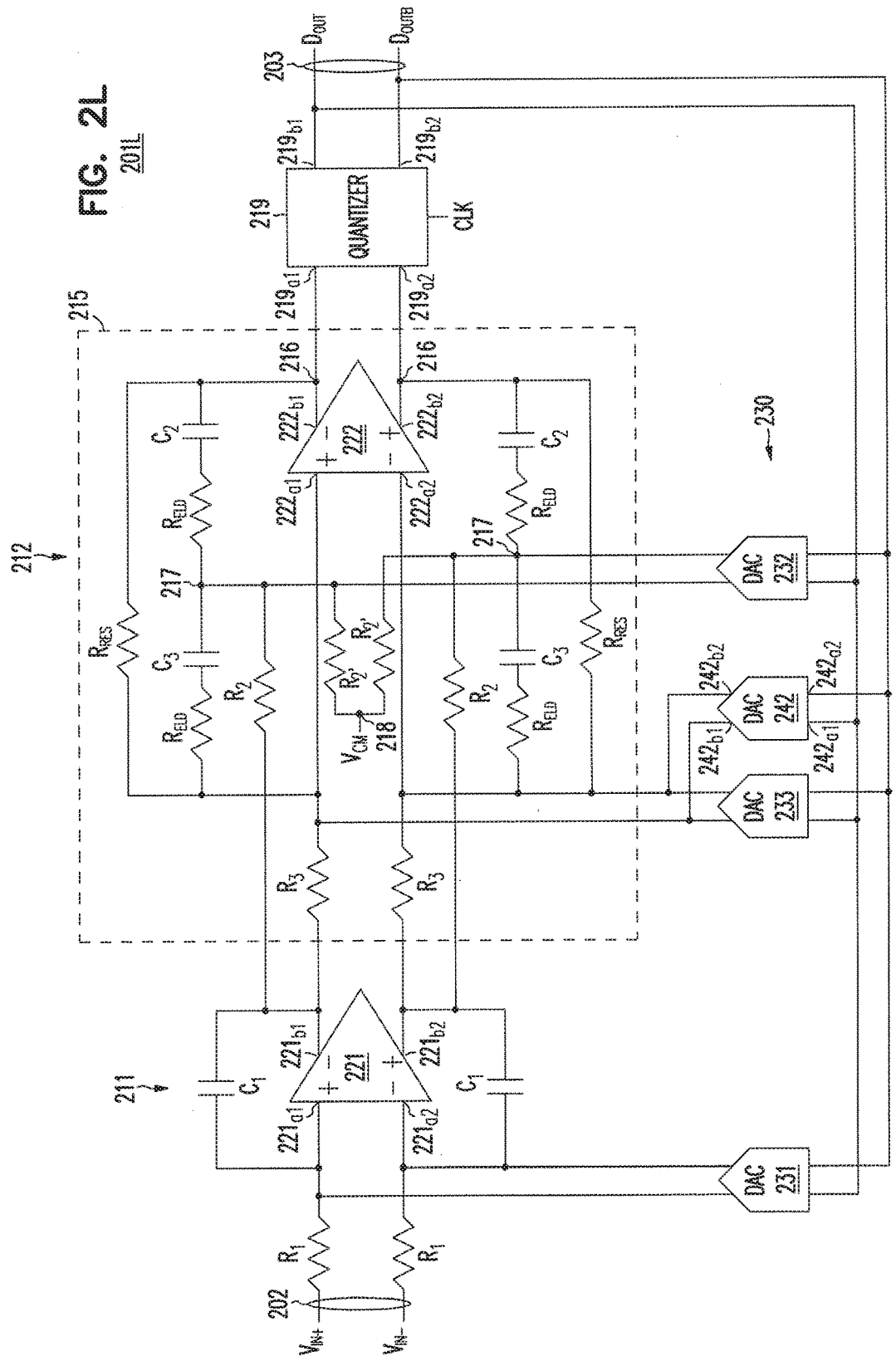

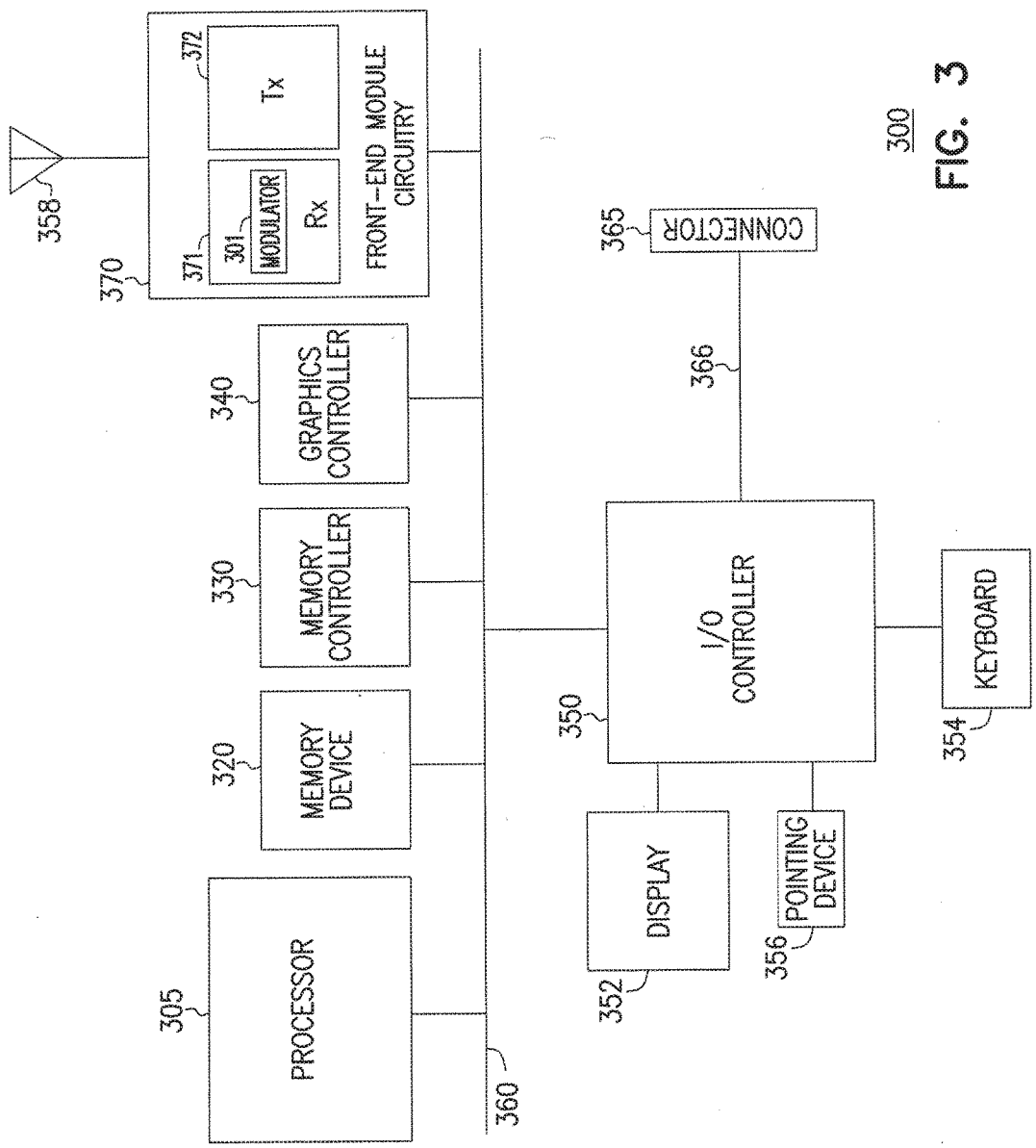

SINGLE AMPLIFER BI-QUAD SIGMA-DELTA MODULATOR

TECHNICAL FIELD

Embodiments described herein pertain to mixed-signal circuits. Some embodiments relate to analog-to-digital converters.

BACKGROUND

Analog-to-digital converters (ADCs) are widely used in electronic devices or systems such as computers, tablets, and cellular phones. An ADC converts analog signals into digital signals. A sigma-delta ADC is one of many types of ADCs. A sigma-delta ADC often has a sigma-delta modulator that can perform a signal filtering function to improve the quality of an analog signal before the signal is passed to another part of the device or system for further processing. In some electronic devices or systems, designing a sigma-delta modulator to meet overall criteria such as signal stability, power consumption, and circuit complexity may pose a challenge.

BRIEF DESCRIPTION OF THE DRAWINGS

FIG. 1A shows a related sigma-delta modulator.

FIG. 1B is a graph showing a frequency response of the sigma-delta modulator of FIG. 1A.

FIG. 2B through FIG. 2M show different variations of the sigma-delta modulator of FIG. 2A, according to some embodiments described herein.

FIG. 3 shows an apparatus in the form of a system (e.g., electronic system), according to some embodiments described herein.

DETAILED DESCRIPTION

Figure 2A:
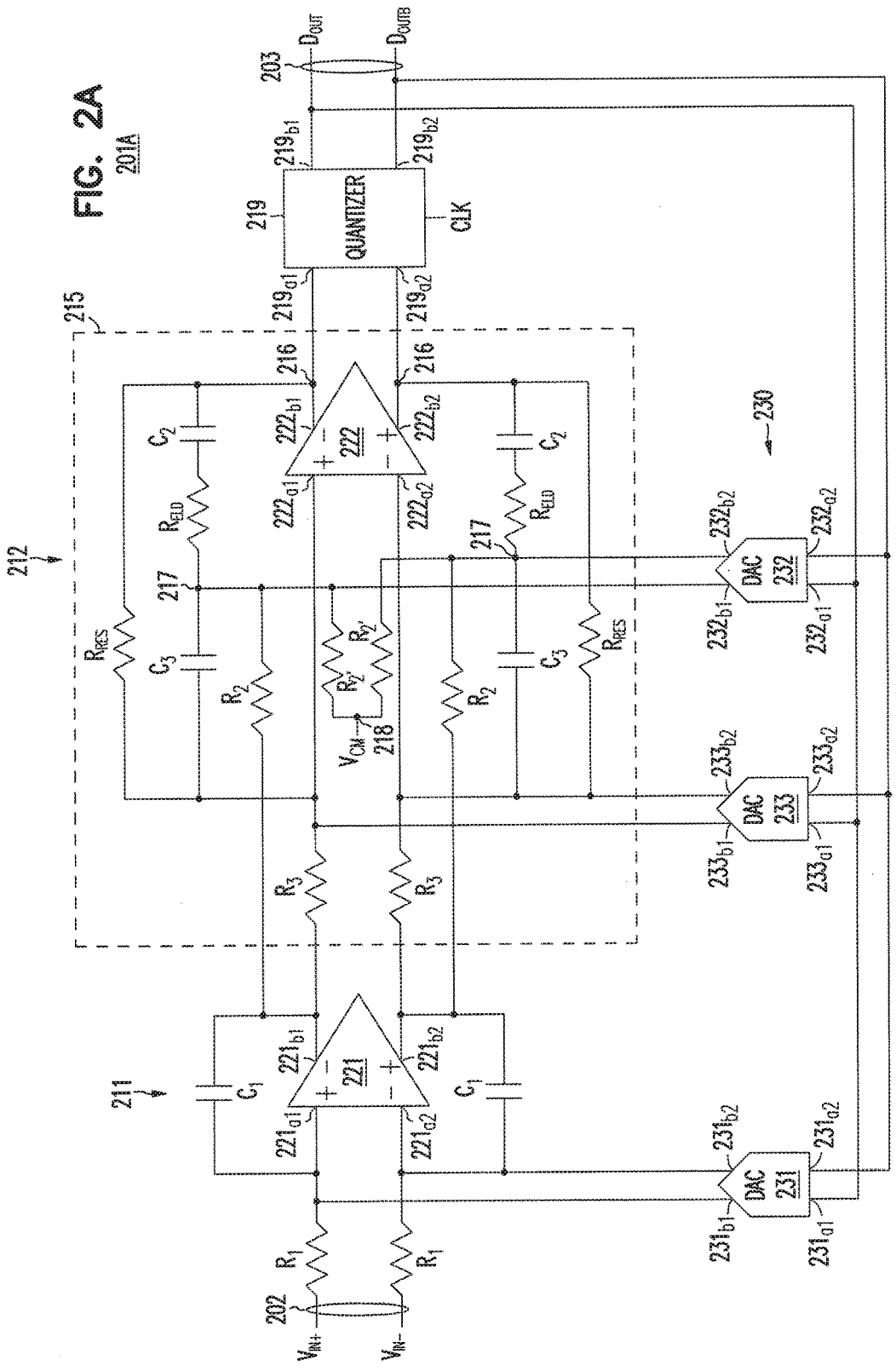
FIG. 2A shows a sigma-delta modulator including a single-amplifier bi-quad (SAB) network and excess loop delay (ELD) compensation, according to some embodiments described herein.

Higher order loop filters within a sigma-delta modulator are commonly used to provide higher signal to noise ratios (SNR) when keeping the over-sampling ratio (OSR) low to save power consumption. A conventional higher order (e.g., second order or higher) sigma-delta modulator usually includes multiple stages and an operational amplifier in each stage. In order to reduce power consumption, some conventional loop filters use an SAB network with a feed-forward loop configuration. Such an SAB network creates a second order transfer function but uses fewer operational amplifiers. However, in some conventional sigma-delta modulators with a feed-forward SAB network, signal transfer function (STF) peaking may occur; power consumption may increase, and compensation for delay (e.g., ELD) in the sigma-delta modulator may be restricted to a specific location in the modulator.

The technique described herein includes a sigma-delta modulator that uses an SAB network with improved operations and structures. In an example, the sigma-delta modulator described herein includes a loop filter having a feedback ELD compensation. The feedback ELD compensation has different example structures that can be arranged at different locations in the sigma-delta modulator. In comparison with similar conventional higher order sigma-delta modulators (e.g., SAB sigma-delta modulators), the sigma-delta modulator described herein includes an improved STF (e.g., no peaking STF) among other improvements. In comparison with some other (e.g., classic) high order sigma-delta modulators, the sigma-delta modulator described herein includes fewer operational amplifiers; but it can have similar characteristics as the other high order sigma-delta modulators. Further, coefficients within the loop filter of the sigma-delta modulator described herein can be remapped to classic higher order sigma-delta modulators with relatively no STF peaking and little change in the noise transfer function (NTF).

FIG. 1A shows a related sigma-delta modulator 101. Sigma-delta modulator 101 is a version of a classic third order sigma-delta modulator. Sigma-delta modulator 101 can receive input information (e.g., analog signals) $V_{IN+}$ and $V_{IN-}$ at input (e.g., input nodes) 102 and generate output information (e.g., digital signals) $D_{OUT}$ and $D_{OUTB}$ at an output (e.g., output nodes) 103. Output information $D_{OUT}$ and $D_{OUTB}$ is a digital representation of input information $V_{IN+}$ and $V_{IN-}$.

As shown in FIG. 1A, sigma-delta modulator 101 includes three stages (e.g., three integrators) 111, 112, and 113, and a quantizer 119 arranged between input 102 and output 103. Quantizer 119 can operate based on timing of a clock signal CLK. Stages 111, 112, and 113 include similar elements. For example, stage 111 includes an operational amplifier 121, resistors $R_1$, and capacitors $C_1$. Stage 112 includes an operational amplifier 122, resistors $R_2$, and capacitors $C_2$. Stage 113 includes an operational amplifier 123, resistors $R_3$, and capacitors $C_3$. Sigma-delta modulator 101 also include resistors $R_{RES}$ and $R_{ELD}$, and a feedback path. The feedback path has digital-to-analog converters (DACs) 131, 132, and 133 to provide feedback information from output 103 to stages 111, 112, and 113, respectively. In this third order arrangement of sigma-delta modulator 101, capacitors $C_1$, $C_2$, and $C_3$ have values in a decreasing order. For example, the value of capacitor $C_1$ is greater than the value of capacitor $C_2$. The value of capacitor $C_2$ is greater than the value of capacitor $C_3$.

As is known to those skilled in the art, ELD may be present in a sigma-delta, such as sigma-delta modulator 101. In FIG. 1A, resistors $R_{ELD}$ are located in the last integrator in stage 113 to form a fast path around quantizer 119 to compensate the ELD in order to stabilize the loop filter between input 102 and output 103 of sigma-delta modulator 101. For example, during operation, when DAC 133 delivers the feedback current, resistors $R_{ELD}$ can produce a proportional step to the feedback current, which recovers the loop to its original state when ELD is present.

FIG. 1B is a graph showing a frequency response of sigma-delta modulator 101 of FIG. 1A. As shown in FIG. 1B, curve 101a has a relatively smooth third order drop off without STF peaking. For comparison purposes, FIG. 1B also shows a curve 140, which is an example frequency response of a conventional sigma-delta modulator with a feed-forward SAB network. As can be seen from FIG. 1B, curve 140 has an STF peaking relative to curve 101a.

Some conventional sigma-delta modulators with a feed-forward SAB network may lack a feedback path from the quantizer to internal nodes in the SAB network. Thus, in order to reduce the voltage swing at such internal nodes, the conventional sigma-delta modulator may include a feed-forward path (e.g., a feed-forward resistor) from an input of the sigma-delta modulator to the quantizer. However, such a feed-forward path may result in significant increase in current drain and speed requirements of the amplifier in the SAB network. Such a feed-forward path may also cause STF peaking (e.g., indicated by curve 140 in FIG. 1B). Further, a conventional sigma-delta modulator using an SAB network may include an adder between the output of the SAB and the quantizer. Such an adder may increase power consumption. The conventional sigma-delta modulator using an SAB network may include a DAC at the output area of the SAB to recover the loop in the presence of ELD. However, that may be the only location for such loop recovery, thereby restricting area flexibility for ELD compensation.

FIG. 2A shows a sigma-delta modulator 201A including an SAB network 215 and ELD compensation, according to some embodiments described herein. Sigma-delta modulator 201A includes fewer operational amplifiers than sigma-delta modulator 101. However, the arrangement of SAB network 215 in sigma-delta modulator 201A allows sigma-delta modulator 201A to operate as a third order sigma-delta modulator similar to sigma-delta modulator 101. The arrangement of SAB network 215 in sigma-delta modulator 201A may also allow sigma-delta modulator 201A to have characteristics similar to, or the same as, sigma-delta modulator 101. For example, in comparison with sigma-delta modulator 101 of FIG. 1A, sigma-delta modulator 201A can have a third order noise shaping capability, a relatively low current drain, relatively no peaking in filtering STF, a similar or the same SNR, a similar or the same overall current drain in the last operational amplifier, and a similar speed.

As shown in FIG. 2A, sigma-delta modulator 201A can include two stages 211 and 212, and a quantizer 219 arranged in a loop filter of sigma-delta modulator 201A between input (e.g., nodes) 202 and an output (e.g., nodes) 203, and a feedback path 230. Input 202 can be arranged to receive input information (e.g., analog signals) $V_{IN+}$ and $V_{IN-}$. Input information $V_{IN+}$ and $V_{IN-}$ can be based on analog signals (e.g., based on radio frequency (RF) signals) received from an antenna. Alternatively, input information $V_{IN+}$ and $V_{IN-}$ can be based on signals received from conductive wires. Stages 211 and 212 and feedback path 230 can operate on input information $V_{IN+}$ and $V_{IN-}$ and provide signals (which are based on information $V_{IN+}$ and $V_{IN-}$ to nodes 216. Quantizer 219 can operate (e.g., based on timing of a clock signal CLK) to quantize the signals at nodes 216 (e.g., compare the signals with reference signals) to provide output information $D_{OUT}$ and $D_{OUTB}$ (e.g., digital signals). Information $D_{OUT}$ and $D_{OUTB}$ represents digital presentation of information $V_{IN+}$ and $V_{IN-}$. Information $D_{OUT}$ and $D_{OUTB}$ may be provided to another functional unit (not shown) for further processing. Quantizer 219 can include a multi-bit resolution ADC. As an example, quantizer 219 can include an N-bit flash ADC (where N is an integer equal to one or greater).

As shown in FIG. 2A, stage 211 can include an amplifier (e.g., operational amplifier) 221, resistors $R_1$, and capacitors $C_1$. Amplifier 221 and capacitors $C_1$ can form part of an integrator of stage 211. Stage 212 can include an amplifier (e.g., operational amplifier) 222, resistors $R_2$, $R_{2'}$, $R_3$, $R_{RES}$, and $R_{ELD}$, and capacitors $C_2$ and $C_3$. The capacitance values of capacitors $C_1$, $C_2$, and $C_3$ can have a decreasing order. For example, the value of capacitor $C_1$ can be greater than the value of capacitor $C_2$. The value of capacitor $C_2$ can be greater than the value of capacitor $C_3$. Some of the components of stage 212 are arranged to form SAB network 215. For example, SAB network 215 can include a single amplifier, which is amplifier 222, and resistors (e.g., $R_2$ and $R_3$) and capacitors (e.g., $C_2$ and $C_3$) arranged as shown in FIG. 2A.

As a comparison, sigma-delta modulator 201A may include only two amplifiers 221 and 222 between input 202 and output 203. In contrast, sigma-delta modulator 101 (FIG. 1) has three amplifiers 121, 122, and 123 between input 102 and output 103. Although sigma-delta modulator 201A includes fewer amplifiers than sigma-delta modulator 101, the arrangement of SAB network 215 (e.g., amplifier 222, resistors $R_2$ and $R_3$ and capacitors $C_2$ and $C_3$) allows stage 212 of sigma-delta modulator 201A to operate (e.g., operate as two integrators) and create two higher frequency poles within the loop filter of sigma-delta modulator 201A. Thus, the combination of stages 211 and 212 allows sigma-delta modulator 201A to operate as a third order loop filter within sigma-delta modulator 201A.

As shown in FIG. 2A, amplifier 221 can include input nodes $221_{a1}$ and $221_{a2}$ and output nodes $221_{b1}$ and $221_{b2}$. Amplifier 222 can include input nodes $222_{a1}$ and $222_{a2}$ and output nodes $222_{b1}$ and $222_{b2}$. Quantizer 219 can include input nodes $219_{a1}$ and $219_{a2}$ and output nodes $219_{b1}$ and $219_{b2}$.

Feedback path 230 can be coupled to (e.g., coupled between) output nodes $219_{b1}$ and $219_{b2}$ of quantizer 219 (which are coupled to output 203 of sigma-delta modulator 201A) and stages 211 and 212. Feedback path 230 can operate to provide feedback information (e.g., current) from quantizer 219 to internal nodes of stages 211 and 212. Feedback path 230 includes DAC 231, 232, and 233 coupled to stages 211 and 212 as shown in FIG. 2A. For example, DAC 231 includes input nodes $231_{a1}$ and $231_{a2}$ coupled to output nodes $219_{b1}$ and $219_{b2}$, respectively, of quantizer 219, and output nodes $231_{b1}$ and $231_{b2}$ coupled to input nodes $221_{a1}$ and $221_{a2}$, respectively, of amplifier 221. DAC 232 includes input nodes $232_{a1}$ and $232_{a2}$ coupled to output nodes $219_{b1}$ and $219_{b2}$, respectively, of quantizer 219, and output nodes $232_{b1}$ and $232_{b2}$ coupled to respective nodes 217 (nodes between capacitors $C_2$ and $C_3$). DAC 233 includes input nodes $233_{a1}$ and $233_{a2}$ coupled to output nodes $219_{b1}$ and $219_{b2}$, respectively, of quantizer 219, and output nodes $233_{b1}$ and $233_{b2}$ coupled to input nodes $222_{a1}$ and $222_{a2}$, respectively, of amplifier 222.

In sigma-delta modulator 201A, the ELD compensation structure is included inside (e.g., internally included in) SAB network 215. The ELD compensation of sigma-delta modulator 201A can include two parts. One part involves the contribution of current (e.g., providing current) from DAC 232 over resistors $R_{ELD}$. The other part involves the contribution of current (e.g., providing current) from DAC 233 over resistors $R_{ELD}$. The combination of these feedback loops can stabilize the loop filter when ELD is present within the loop filter in sigma-delta modulator 201A. As shown in FIG. 2A, stage 212 may receive a voltage (e.g., common mode voltage) $V_{CM}$ at a node (e.g., common node) 218 to bias nodes 217 through resistors $R_{2'}$ to maintains proper voltage swing at nodes 217 during operation.

DACs 231, 232, and 233, and resistors $R_{ELD}$ can correspond to DACs 131, 132, and 133, and resistors $R_{ELD}$, respectively, of FIG. 1. However, due to the inclusion of SAB network 215 in sigma-delta modulator 201A, the arrangements (e.g., circuit connections) of DACs 231, 232, and 233, and resistors $R_{ELD}$ in FIG. 2A are different from that of sigma-delta modulator 101. By arranging DACs 231, 232, and 233 as shown in FIG. 2A, the coefficients within the loop can be remapped to sigma-delta modulator 101 with relatively no STF peaking and little change in the noise transfer function (NTF). This may allow sigma-delta modulator 201A to have characteristics (as mentioned above) at least similar to sigma-delta modulator 101.

As shown in FIG. 2A, current from DAC 232 is the closest to output (e.g., nodes) 216 of SAB network 215 with its feedback coefficient being determined over capacitor $C_2$, and its feed-in coefficients determined by resistor $R_2$ to capacitor $C_2$. The feedback coefficient associated with DAC 233 is the series combination of capacitors $C_3$ and $C_2$. This feedback coefficient (e.g., series combination of capacitors $C_3$ and $C_2$) can be made to match the value of capacitor $C_3$ in sigma-delta modulator 101. Thus, the feed-in coefficients associated with DAC 233 are determined by resistor $R_3$ to the series combination of capacitors $C_3$ and $C_2$. Arranging DAC 232 and DAC 233 as shown in FIG. 2A (e.g., DAC 232 is closer to amplifier 222 than DAC 233) allows the series combination of capacitors $C_3$ and $C_2$ to provide a smaller effective capacitor (e.g., similar to the value of capacitor $C_3$ of FIG. 1A) in order to maintain the high frequency pole within SAB network 215 of sigma-delta modulator 201A.

In FIG. 2A, the overall filter may not be impacted (e.g., may not change) by having all feedback paths (e.g., DACs 231, 232, and 233 and resistors $R_{ELD}$) and no feed-forward path (e.g., no feed-forward path from input 202 to nodes 216). Having no feed-forward path may prevent STF peaking in sigma-delta modulator 201A. SAB network 215 can create an additional path that includes resistor $R_2$ to capacitor $C_2$, which feeds around path $R_3$ (e.g., normal path) to the series combination of capacitors $C_3$ and $C_2$. This additional path will result in a second roll off in the STF without peaking.

As described above with reference to FIG. 2A, sigma-delta modulator 201A has fewer amplifiers than sigma-delta modulator 101. However, with the inclusion of SAB network 215 and the internal feedback ELD compensation, sigma-delta modulator 201A can have characteristics similar to sigma-delta modulator 101. In comparison with conventional sigma-delta modulators having SAB network with a feed-forward loop configuration, sigma-delta modulator 201A can have an improved STF (e.g., no peaking STF), improved (e.g., reduced) power consumption, and other improvements as described above.

FIG. 2B through FIG. 2M show variations of sigma-delta modulator 201A of FIG. 2A, according to some embodiments described herein. In FIG. 2A, resistors $R_{ELD}$ can operate as part of an ELD compensation structure (e.g., circuitry) to compensate ELD in sigma-delta modulator 201A. However, as described below, the ELD compensation structure can also include at least one DAC (e.g., ELD DAC) located on feedback path 230. FIG. 2B through FIG. 2M show different locations for the ELD compensation structure, in which the ELD compensation structure can include resistors $R_{ELD}$, ELD DAC, or combination of both resistors $R_{ELD}$ and ELD DAC.

In FIG. 2B through FIG. 2M, each of sigma-delta modulators 201B, 201C, 201D, 201E, 201F, 201G, 201H, and 201I can be a variation of sigma-delta modulator 201A. Thus, for simplicity, similar, or the same, components in FIG. 2A through FIG. 2M are not repeated. The description with reference to FIG. 2B through FIG. 2M focuses on the locations and connections of the ELD compensation structure.

As shown in FIG. 2B, sigma-delta modulator 201B can include an ELD compensation structure, which can include resistors $R_{ELD}$ coupled between respective capacitors $C_3$ and input nodes $222_{a1}$ and $222_{a2}$ of amplifier 222.

Figure 2C:
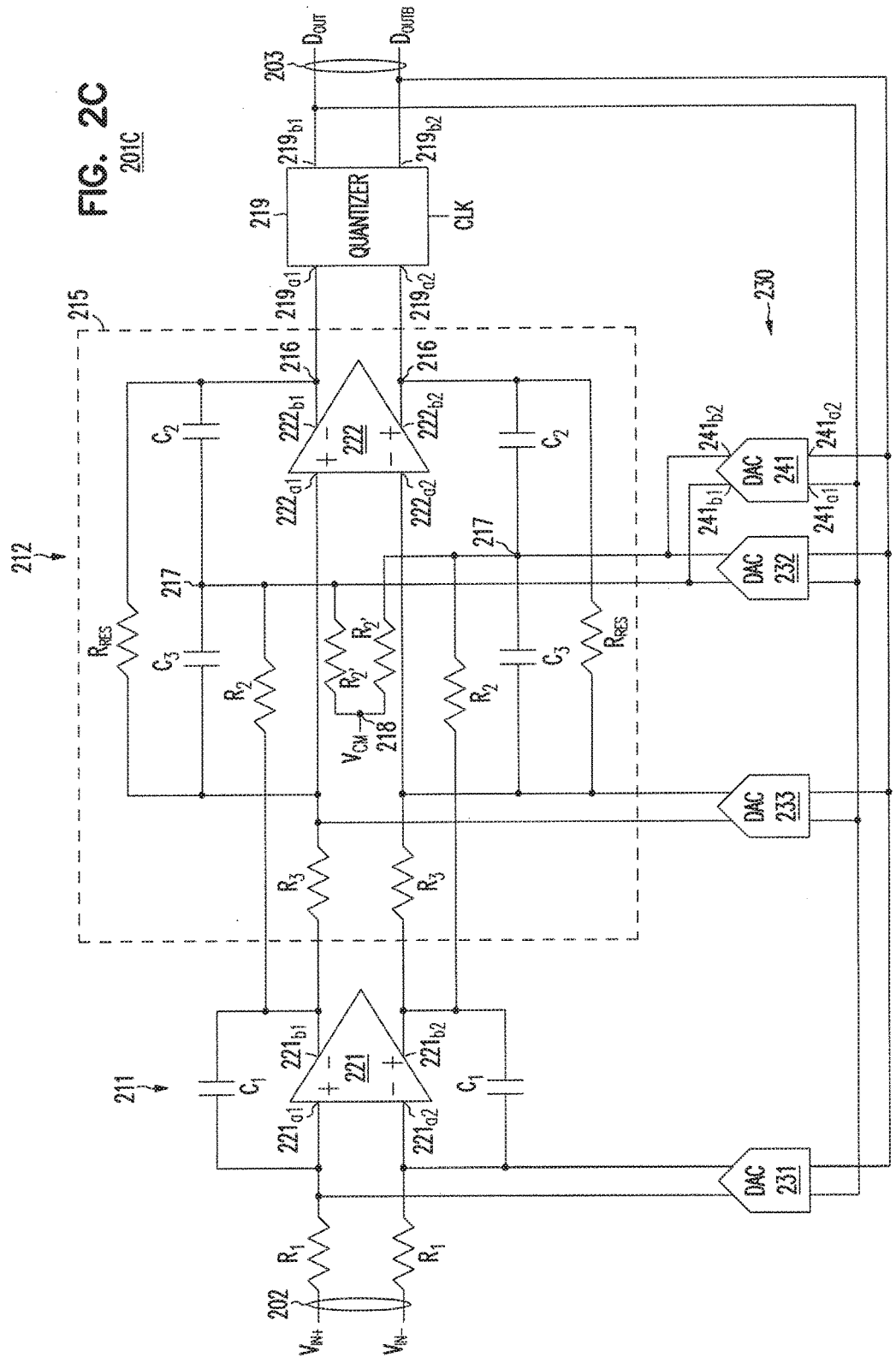

In FIG. 2C, sigma-delta modulator 201C can include an ELD compensation structure, which can include ELD DAC 241 on feedback path 230, without including resistors (such as resistors $R_{ELD}$ in FIG. 2A and FIG. 2B) coupled in series with capacitors $C_2$ and $C_3$ between input nodes ($222_{a1}$ and $222_{a2}$) and output nodes ($222_{b1}$ and $222_{b2}$) of amplifier 222. As shown in FIG. 2C, ELD DAC 241 can include input nodes $241_{a1}$ and $241_{a2}$ coupled to output nodes $219_{b1}$ and $219_{b2}$, respectively, of quantizer 219, and output nodes $241_{b1}$ and $241_{b2}$ coupled to nodes 217.

Figure 2D:
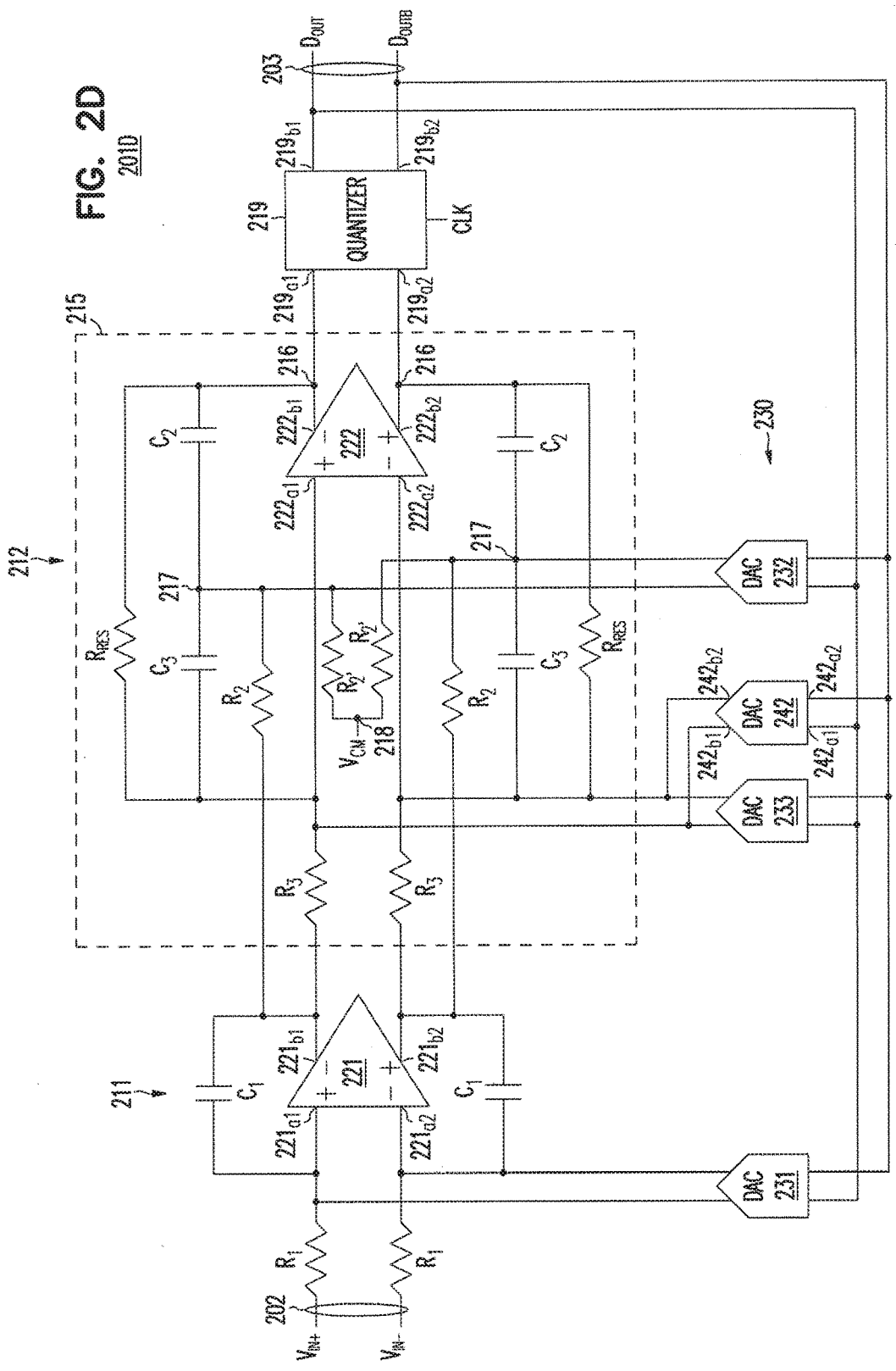

In FIG. 2D, sigma-delta modulator 201D can include an ELD compensation structure, which can include ELD DAC 242 on feedback path 230, without including resistors (such as resistors $R_{ELD}$ in FIG. 2A and FIG. 2B) coupled in series with capacitors $C_2$ and $C_3$ between input nodes ($222_{a1}$ and $222_{a2}$) and output nodes ($222_{b1}$ and $222_{b2}$) of amplifier 222. As shown in FIG. 2D, ELD DAC 242 can include input nodes $242_{a1}$ and $242_{a2}$ coupled to output nodes $219_{b1}$ and $219_{b2}$, respectively, of quantizer 219, and output nodes $242_{b1}$ and $242_{b2}$ coupled to input nodes $222_{a1}$ and $222_{a2}$, respectively, of amplifier 222.

Figure 2E:
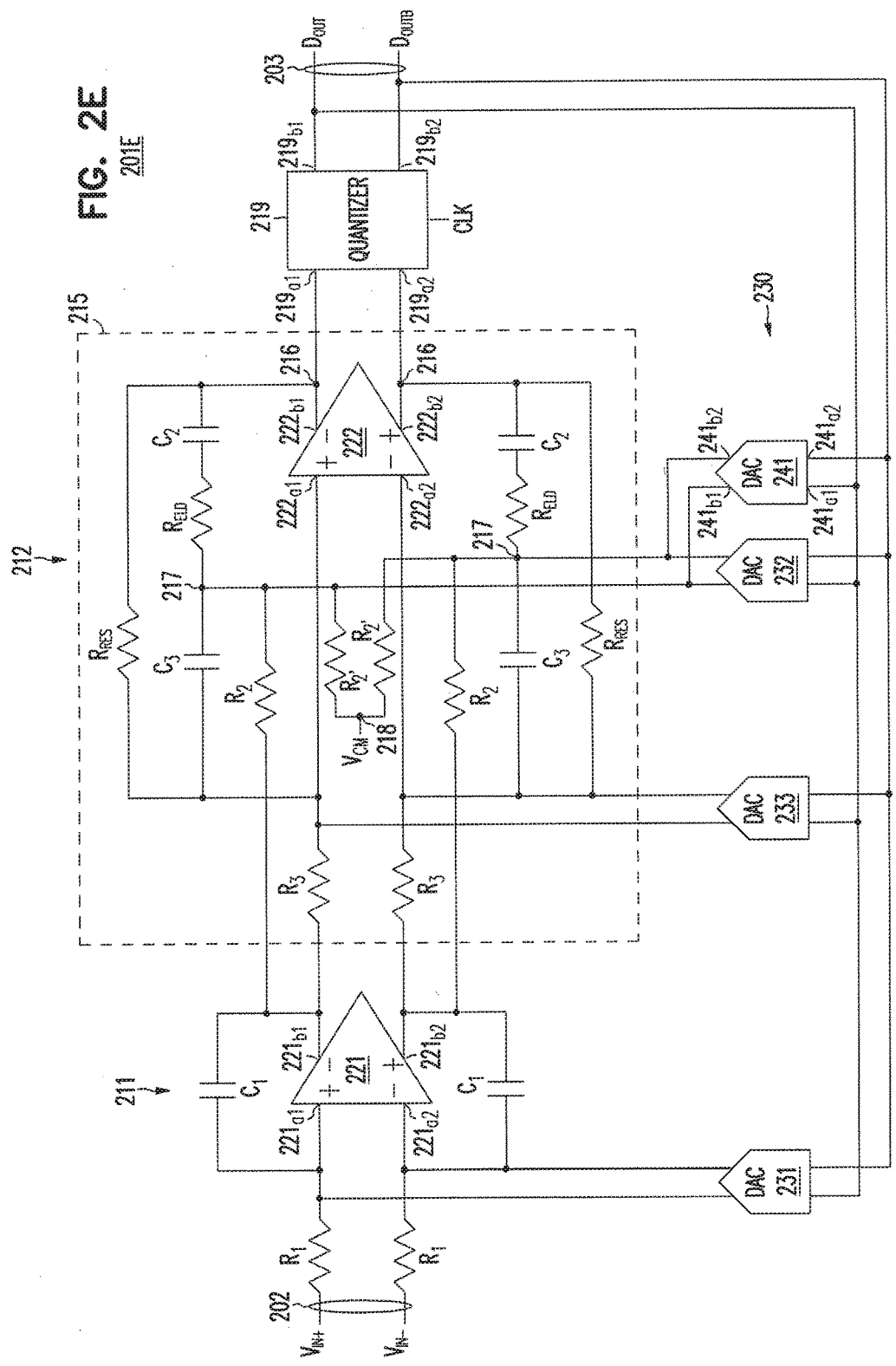

In FIG. 2E, sigma-delta modulator 201E can include an ELD compensation structure, which can include a combination of resistors $R_{ELD}$ and ELD DAC 241. The connections of resistors $R_{ELD}$ and ELD DAC 241 are the same as those in FIG. 2A and FIG. 2C, respectively.

Figure 2F:
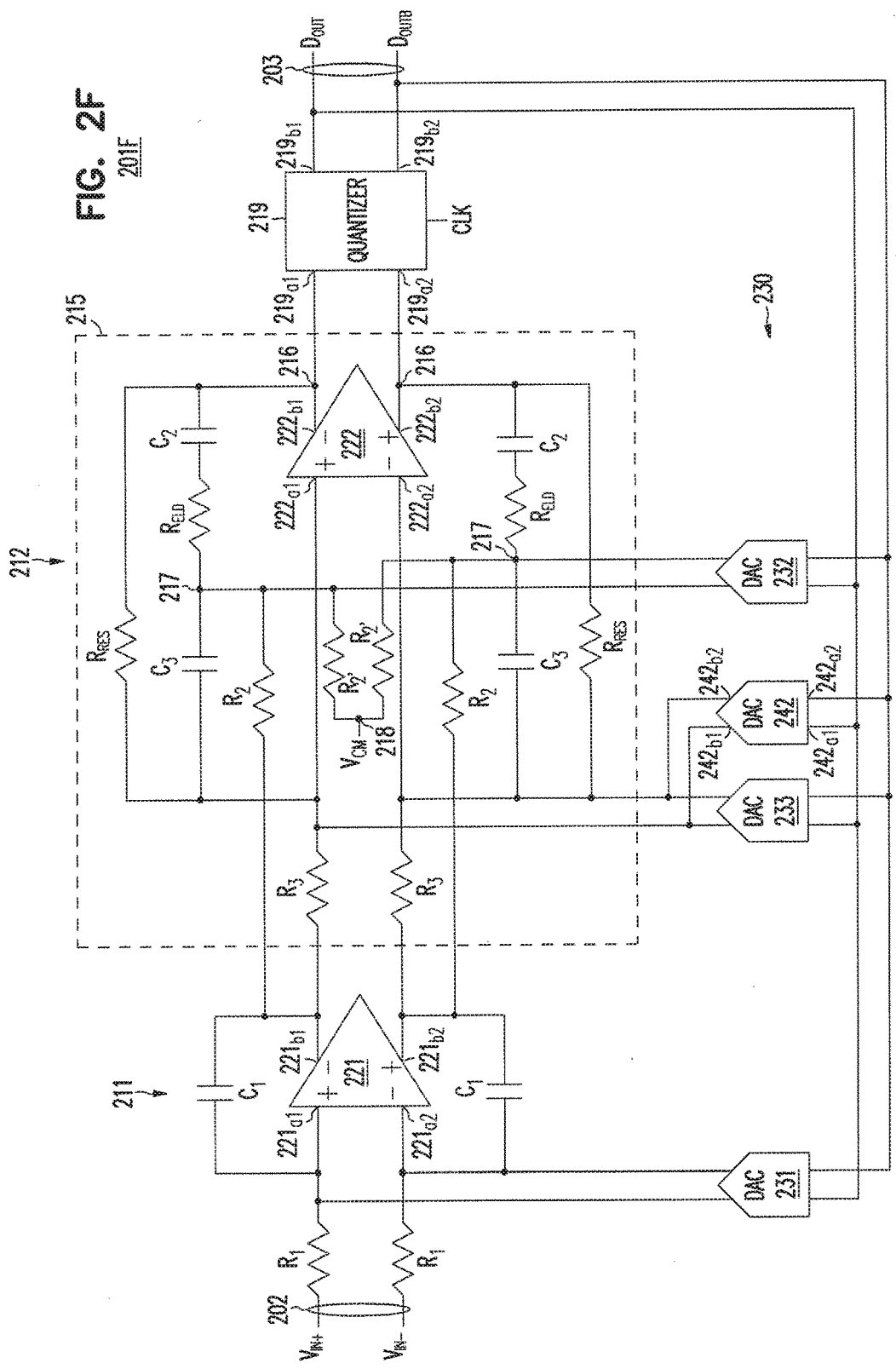

In FIG. 2F, sigma-delta modulator 201F can include an ELD compensation structure, which can include a combination of resistors $R_{ELD}$ and ELD DAC 242. The connections of resistors $R_{ELD}$ and ELD DAC 242 are the same as those in FIG. 2A and FIG. 2D, respectively.

In FIG. 2G, sigma-delta modulator 201G can include an ELD compensation structure, which can include a combination of resistors $R_{ELD}$ and ELD DAC 242. The connections of resistors $R_{ELD}$ and ELD DAC 241 are the same as those in FIG. 2B and FIG. 2D, respectively.

Figure 2H:
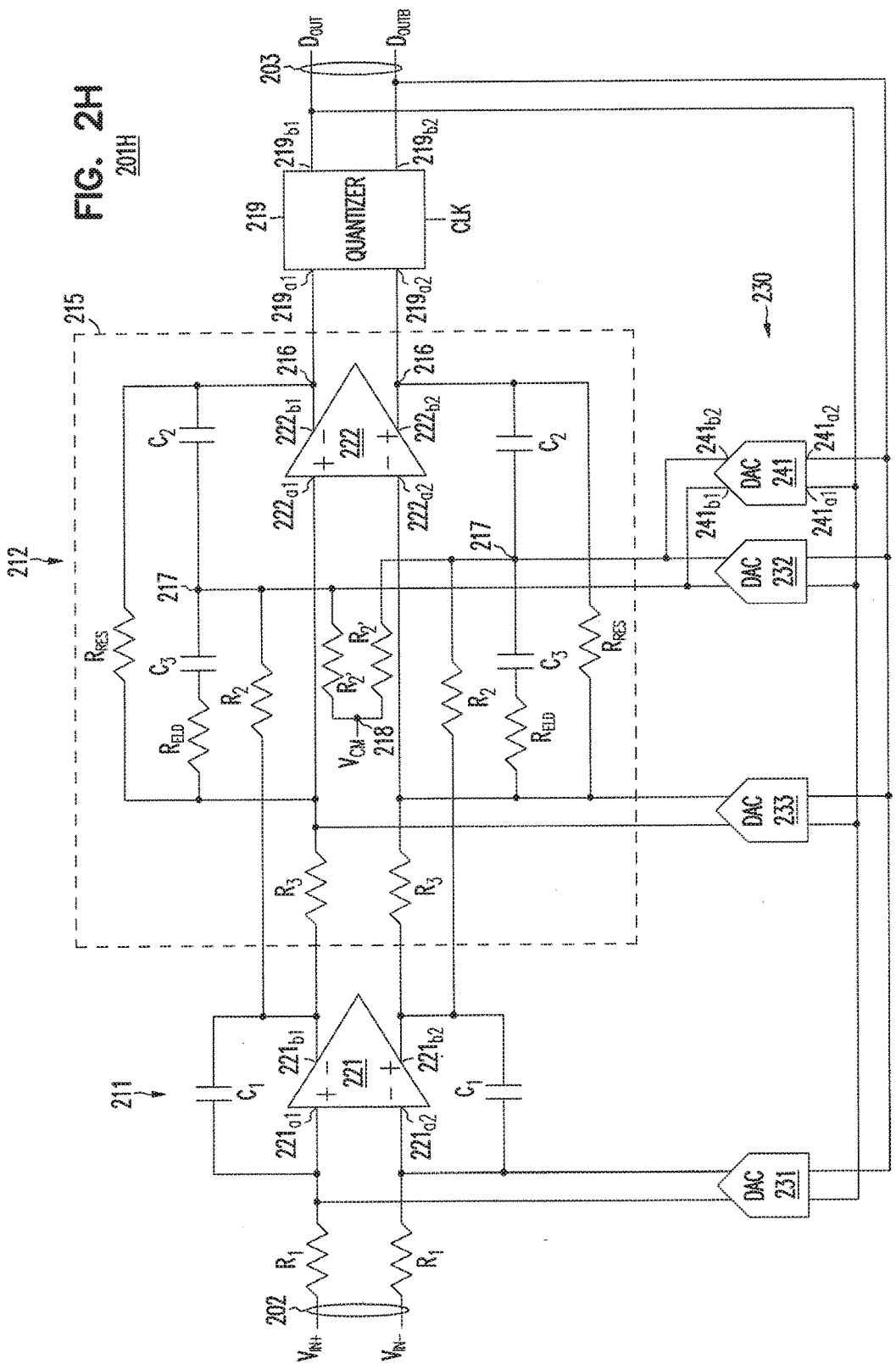

In FIG. 2H, sigma-delta modulator 201H can include an ELD compensation structure, which can include a combination of resistors $R_{ELD}$ and ELD DAC 241. The connections of resistors $R_{ELD}$ and ELD DAC 241 are the same as those in FIG. 2B and FIG. 2C, respectively.

In FIG. 2I, sigma-delta modulator 201I can include an ELD compensation structure, which can include a combination of four resistors $R_{ELD}$. The connections of the four resistors $R_{ELD}$ resistors are the same as those in FIG. 2A and FIG. 2B.

In FIG. 2J, sigma-delta modulator 201J can include an ELD compensation structure, which can include ELD DAC 241 and ELD DAC 242. The connections of ELD DAC 241 and ELD DAC 242 are the same as those in FIG. 2C and FIG. 2D, respectively.

In FIG. 2K, sigma-delta modulator 201K can include an ELD compensation structure, which can include a combination of four resistors RE, and ELD DAC 241. The connections of the four resistors $R_{ELD}$ resistors are the same as those in FIG. 2A and FIG. 2B. The connections of ELD DAC 241 are the same as those in FIG. 2C.

In FIG. 2L, sigma-delta modulator 201L can include an ELD compensation structure, which can include a combination of four resistors $R_{ELD}$ and ELD DAC 241. The connections of the four resistors $R_{ELD}$ resistors are the same as those in FIG. 2A and FIG. 2B. The connections of ELD DAC 242 are the same as those in FIG. 2D.

Figure 2M:
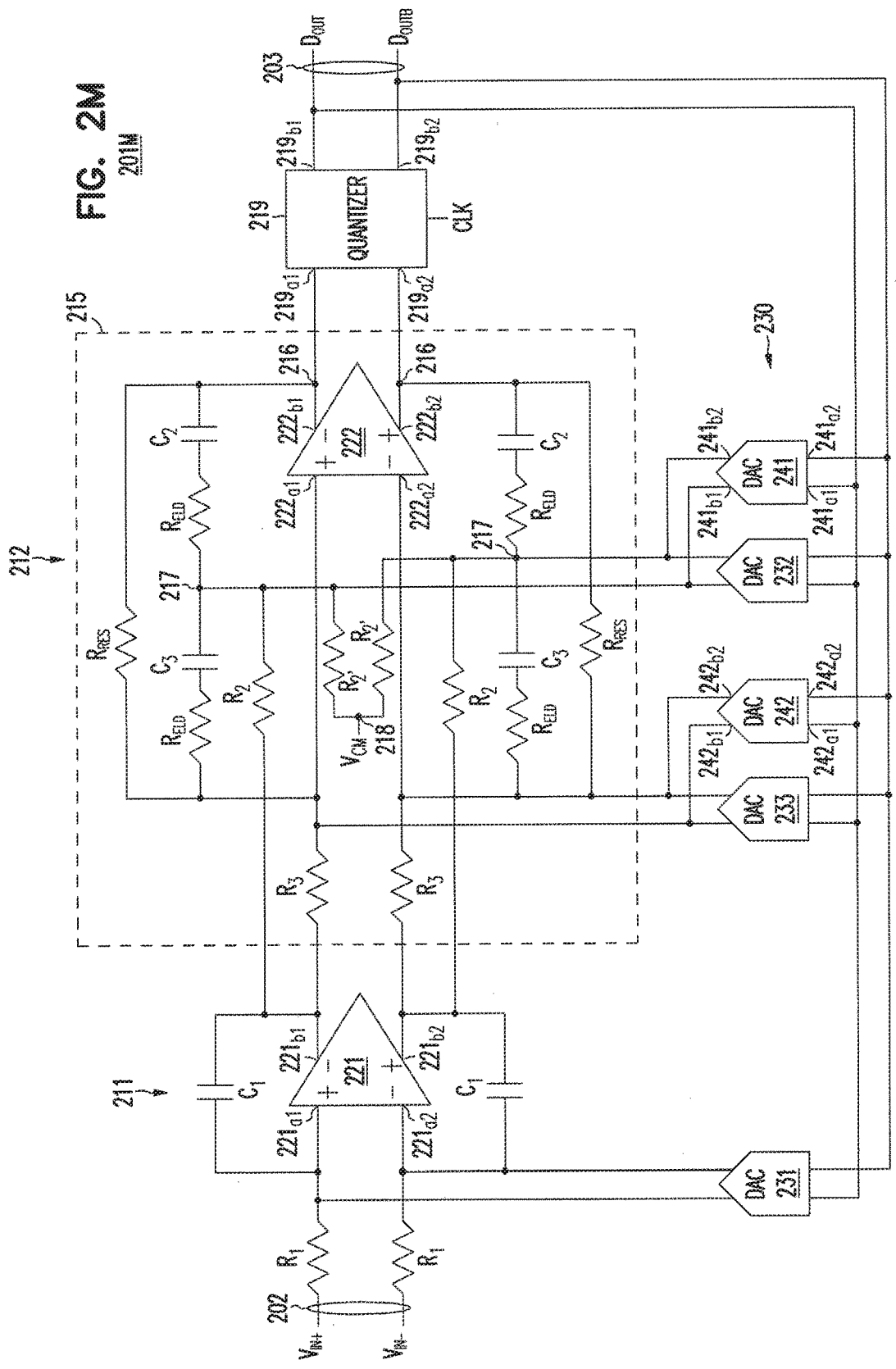

In FIG. 2M, sigma-delta modulator 201M can include an ELD compensation structure, which can include a combination of four resistors $R_{ELD}$, ELD DAC 241, and ELD DAC 242. The connections of the four resistors $R_{ELD}$ resistors are the same as those in FIG. 2A and FIG. 2B. The connections of ELD DAC 241 and ELD DAC 242 are the same as those in FIG. 2C and FIG. 2D, respectively.

In FIG. 2A through FIG. 2M, each of the sigma-delta modulators (e.g., 201A, 201B, 201C, 201D, 201E, 201F, 201G, 201H, 201I, 200J, 200K, 200L, and 200M) is shown in a differential configuration, as an example. However, in some arrangements, each of the sigma-delta modulators (e.g., 201A, 201B, 201C, 201D, 201E, 201F, and 201G) can be arranged in a single-end configuration. For example, in a single-ended configuration, the sigma-delta modulator (e.g., 201A, 201B, 201C, 201D, 201E, 201F, 201G, 201H, 201I, 200J, 200K, 200L, and 200M) may omit one resistor from each pair of resistors $R_1$, $R_2$, $R_{2'}$, $R_3$, $R_{ELD}$, and $R_{RES}$, and one capacitor from each of pair of capacitors $C_1$, $C_2$, and $C_3$. In the single-ended configuration, the sigma-delta modulator may not use one of input nodes 202 and one of output nodes 203, and each of DAC 231, 232, and 233 may not use one of the DAC input nodes and its associated connection, and one of the DAC output nodes and its associated connection.

In FIG. 2A through FIG. 2M show each of the sigma-delta modulators (e.g., 201A, 201B, 201C, 201D, 201E, 201F, 201G, 201H, 201I, 200J, 200K, 200L, and 200M) being configured to operate as a third order sigma delta modulator as an example. The technique described herein can be used to create other higher (e.g., fourth, fifth, or higher) order sigma delta modulators that can include at least one SAB network (e.g., SAB network 215) described above with reference to FIG. 2A through FIG. 2M. For example, any of the sigma-delta modulators described above with reference to FIG. 2A through FIG. 2M can be modified to operate as a fourth order sigma-delta modulator. In this example, the sigma-delta modulator can be modified to include two stages, in which each of the two stages can include an SAB network (e.g., SAB network 215). In another example, any of sigma-delta modulators described above with reference to FIG. 2A through FIG. 2M can be modified to operate as a fifth order sigma-delta modulator. In this example, the sigma-delta modulator can be modified include three stages, in which one stage among the three stages can include an integrator (e.g., the integrator in stage 211) and each of the other two stages among the three stages can include an SAB network (e.g., SAB network 215).

FIG. 3 shows an apparatus in the form of a system (e.g., electronic system) 300, according to some embodiments described herein. System 300 can include or be included in a computer, a tablet, a communication device (e.g., user equipment (UE), a cellular phone, etc.), or other electronic devices or systems. As shown in FIG. 3, system 300 can include a processor 305, a memory device 320, a memory controller 330, a graphics controller 340, an input and output (I/O) controller 350, a display 352, a keyboard 354, a pointing device 356, at least one antenna 358, a bus 360, a connector 365, and a front-end module circuitry 370.

Each of processor 305, memory device 320, memory controller 330, graphics controller 340, and I/O controller 350 can include an integrated circuit (IC) chip. In some arrangements, system 300 does not have to include a display. Thus, display 352 can be omitted from system 300. In some arrangements, system 300 does not have to include any antenna. Thus, antenna 358 can be omitted from system 300. Processor 305 can include a general-purpose processor or an application specific integrated circuit (ASIC). Processor 305 can include a central processing unit (CPU).

Memory device 320 can include a dynamic random access memory (DRAM) device, a static random access memory (SRAM) device, a flash memory device, phase change memory, a combination of these memory devices, or other types of memory. FIG. 3 shows an example where memory device 320 is a stand-alone memory device separated from processor 305. In an alternative arrangement, memory device 320 and processor 305 can be located on the same die (e.g., a semiconductor die). In such an alternative arrangement, memory device 320 is an embedded memory in processor 305, such as embedded DRAM (eDRAM), embedded SRAM (eSRAM), embedded flash memory, or another type of embedded memory.

Display 352 can include a liquid crystal display (LCD), a touchscreen (e.g., capacitive or resistive touchscreen), or another type of display. Pointing device 356 can include a mouse, a stylus, or another type of pointing device.

I/O controller 350 can include a communication module for wired or wireless communication (e.g., communication through front-end module circuitry 370 and one or more antenna 358). Such wireless communication may include communication in accordance with Bluetooth communication technique, WiFi communication technique, Long Term Evolution Advanced (LTE-A) communication technique, or other communication techniques.

I/O controller 350 can also include a module to allow system 300 to communicate with other devices or systems, in accordance with to one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), and other specifications.

Connector 365 can be arranged (e.g., can include terminals, such as pins) to allow system 300 to be coupled to an external device (or system). This may allow system 300 to communicate (e.g., exchange information) with such a device (or system) through connector 365. Connector 365 may be coupled to I/O controller 350 through a connection 366 (e.g., a bus). Connector 365, connection 366, and at least a portion of bus 360 can include conductive lines that conform with at least one of USB, DP, HDMI, Thunderbolt, PCIe, and other specifications.

Antenna 358 can include one or more directional or omnidirectional antennas, including, for example, dipole antennas, monopole antennas, patch antennas, loop antennas, microstrip antennas or other types of antennas suitable for transmission of RF signals.

Front-end module circuitry 370 can include a receiver (Rx) 371 and a transmitter (Tx) 372. Transmitter 372 can operate to transmit information from system 300 to an external device or system through antenna 358. Receiver 371 can operate to receive input information (e.g., analog input signals) from antenna 358. Receiver 371 can include a modulator 301, which can include any of the modulators (e.g., sigma-delta modulators 201A through 210I) described above with reference to FIG. 2A through FIG. 2M.

FIG. 3 shows the components of system 300 arranged separately from each other as an example. For example, each of processor 305, memory device 320, memory controller 330, graphics controller 340, I/O controller 350, and front-end module circuitry 370 can be located on a separate IC (e.g., semiconductor die or an IC chip). In some arrangements, two or more components (e.g., processor 305, memory device 320, graphics controller 340, I/O controller 350, and front-end module circuitry 370) of system 300 can be located on the same die (e.g., same IC chip) that forms a system-on-chip (SoC).

Figure 4:
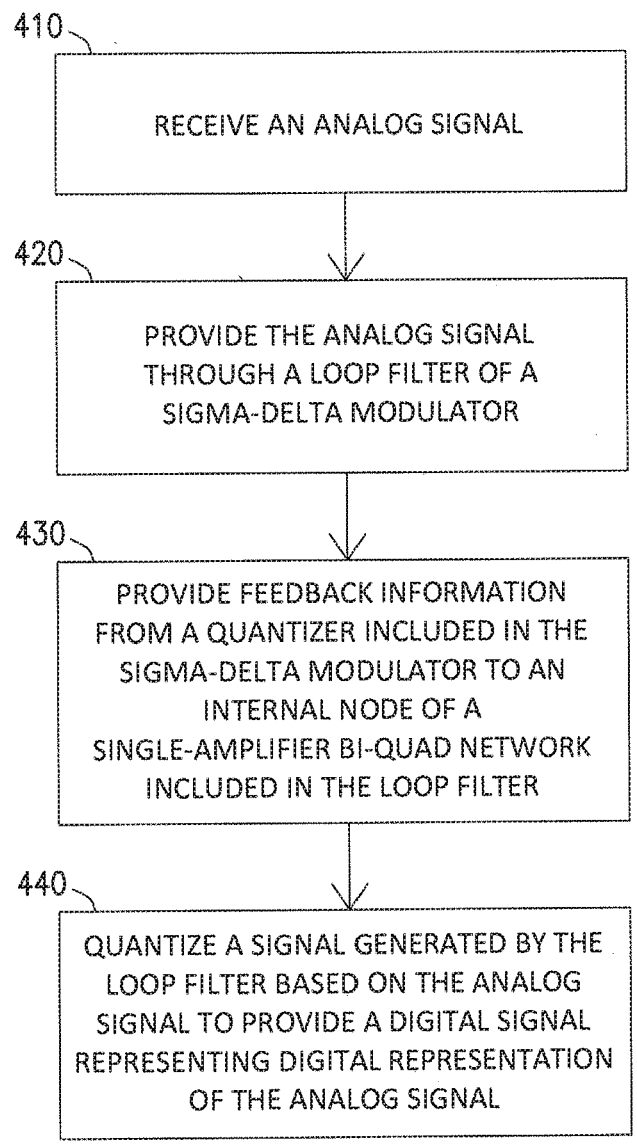
FIG. 4 is a flowchart showing a method of processing signals, according to some embodiments described herein.

FIG. 4 is a flowchart showing a method 400 of processing signals, according to some embodiments described herein.

Method 400 can be used in (e.g. performed by) a device or system that includes a modulator. Such a modulator can include any of sigma-delta modulators 201A through 210I described above with reference to FIG. 2A through FIG. 3. Thus, activities of method 400 can include operations performed by any of sigma-delta modulators 201A through 210I described above with reference to FIG. 2A through FIG. 3.

In FIG. 4, activity 410 can include receiving an analog signal. Activity 420 can include providing the analog signal through a loop filter of a sigma-delta modulator. Activity 430 can include providing feedback information from a quantizer included in the sigma-delta modulator to an internal node of an SAB network included in the loop filter. Activity 440 can include quantizing a signal generated by the loop filter based on the analog signal to provide a digital signal, which represents digital representation of the analog signal.

Method 400 can include fewer or more activities relative to the activities shown in FIG. 4. For example, method 400 can include activities and operations of any of sigma-delta modulators 201A through 210I described above with reference to FIG. 1 through FIG. 3.

The illustrations of the apparatuses (e.g., modulators 201A through 201I and 301, receiver 371, and system 300) and methods (e.g., method 400 and operations of modulators 201A through 201I and 301, receiver 371, and system 300) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

As used in this application and in the claims, a list of items joined by the term "at least one of" can mean any combination of the listed terms. For example, the phrase "at least one of A. B and C" can mean A, B; C; A and B; A and C; B and C; or A, B and C.

ADDITIONAL NOTES AND EXAMPLES

Example 1 includes subject matter (such as a device, an electronic apparatus (e.g., circuit, electronic system, or both), or a machine) including a first stage including an integrator, a second stage coupled to the first stage, the second stage including an amplifier, a first capacitor, and a second capacitor coupled in series with the first capacitor between an input node and an output node of the amplifier, a quantizer coupled to the output node of the amplifier, and a feedback path coupled to an output node of the quantizer and to the first and second stages, the feedback path including a digital-to-analog converter (DAC), the DAC including an input node coupled to the output node of the quantizer and an output node coupled to the input node of the amplifier.

In Example 2, the subject matter of Example 1 may optionally include, wherein the second stage includes a resistor coupled in series with the first and second capacitors between the input and output nodes of the amplifier.

In Example 3, the subject matter of Example 1 or 2 may optionally include, wherein the feedback path includes an additional DAC, the additional DAC including an input node coupled to the output node of the quantizer and an output node coupled to a node between the first and second capacitors.

In Example 4, the subject matter of Example 3 may optionally include, wherein the feedback path includes another additional DAC coupled between the output node of the quantizer and the first stage.

In Example 5, the subject matter of any of Examples 1-3 may optionally include, wherein the feedback path includes an additional DAC, the additional DAC including an input node coupled to the output node of the quantizer and an output node coupled to the input node of the second amplifier.

In Example 6, the subject matter of any of Examples 1-3 may optionally include, wherein the first capacitor is coupled between the second capacitor and the output node of the amplifier, and the first capacitor has a capacitance value greater than a capacitance value of the second capacitor.

In Example 7, the subject matter of any of Examples 1-3 may optionally include, wherein the first stage and the second stage are arranged in a loop filter of a sigma-delta modulator.

In Example 8, the subject matter of Example 7 may optionally include, wherein the second stage is arranged to create two poles within the loop filter.

Example 9 includes subject matter (such as a device, an electronic apparatus (e.g., circuit, electronic system, or both), or a machine) including a first stage including a first amplifier located in a loop filter path of a sigma-delta modulator, a second stage coupled to the first stage, the second stage including a single amplifier bi-quad network, the single amplifier bi-quad network including a second amplifier and capacitor coupled to an output node of the second amplifier, a quantizer including an input node coupled to the output node of the second amplifier, and a feedback path coupled to an output node of the quantizer and to the first and second stages.

In Example 10, the subject matter of Example 9 may optionally include, wherein the capacitor is a first capacitor, and the second stage includes a second capacitor, and a resistor coupled in series with the first and second capacitors between an input node of the second amplifier and the output node of the second amplifier.

In Example 11, the subject matter of Example 10 may optionally include, wherein the feedback path includes a digital-to-analog converter (DAC), the DAC including an input node coupled to the output node of the quantizer and an output node to the input node of the second amplifier.

In Example 12, the subject matter of Example 11 may optionally include, wherein the feedback path includes an additional DAC, the additional DAC including an input node coupled to the output node of the quantizer and an output node directly coupled to one of the first and second capacitors.

In Example 13, the subject matter of any of Example 9-12 may optionally include, wherein the quantizer includes a multi-bit resolution analog-to-digital converter.

In Example 14, the subject matter of Example 13 may optionally include, wherein the analog-to-digital converter includes a flash analog-to-digital converter.

Example 15 includes subject matter (such as a device, an electronic apparatus (e.g., circuit, electronic system, or both), or a machine) including a first stage including a first amplifier, a second stage including a second amplifier, the second amplifier including an input node coupled to an output node of the first amplifier through a resistor, a first capacitor and a second capacitor coupled in series between the input node and an output node of the second amplifier, a quantizer coupled to the output node of the second amplifier, a first digital-to-analog converter (DAC) coupled between an output node of the quantizer and the first stage, a second DAC coupled between the output node of the quantizer and a node between the first and second capacitors, and a third DAC coupled between the output node of the quantizer and the input node of the second amplifier.

In Example 16, the subject matter of Example 15 may optionally include, wherein the second stage includes an additional resistor coupled in series with the first and second capacitors between the input and output nodes of the second amplifier.

In Example 17, the subject matter of Example 16 may optionally include, wherein the additional resistor is a first additional resistor, and the second stage includes a second additional resistor coupled in parallel with a combination of the first additional resistor and the first and second capacitors between the input and output nodes of the second amplifier.

In Example 18, the subject matter of Example 17 may optionally include, wherein the second stage includes a third additional resistor coupled between the output node of the first amplifier and the first additional resistor.

In Example 19, the subject matter of Example 18 may optionally include, wherein the second stage includes a fourth resistor coupled between the first additional resistor and a common node.

In Example 20, the subject matter of any of Examples 15-19 may optionally include, further comprising a fourth DAC coupled between the output node of the quantizer and a node between the first and second capacitors.

In Example 21, the subject matter of any of Examples 15-19 may optionally include, further comprising a fourth DAC coupled between the output node of the quantizer and the input node of the second amplifier.

Example 22 includes subject matter such as a device, an electronic apparatus (e.g., circuit, electronic system, or both), or a machine) including an antenna, and a receiver coupled to the antenna, the receiver including a sigma-delta modulator, the sigma-delta modulator including a first stage including an integrator, a second stage coupled to the first stage, the second stage including an amplifier, a first capacitor, and a second capacitor coupled in series with the first capacitor between an input node and an output node of the amplifier, a quantizer coupled to the output node of the amplifier, and a feedback path coupled to an output node of the quantizer and to the first and second stages, the feedback path including a digital-to-analog converter (DAC), the DAC including an input node coupled to the output node of the quantizer and an output node coupled to the input node of the amplifier.

In Example 23, the subject matter of Example 22 may optionally include, wherein the second stage includes at least one resistor coupled in series with the first and second capacitors between the input node and the output node of the amplifier.

In Example 24, the subject matter of Example 22 or 23 may optionally include, wherein the feedback path includes at least one of a first additional DAC including an input node coupled to the output node of the quantizer and an output node coupled to a node between the first and second capacitors, and a second additional DAC including an input node coupled to the output node of the quantizer and an output node coupled to the input node of the amplifier.

In Example 25, the subject matter of Example 22 or 23 may optionally include, wherein the receiver is included in a front-end module circuitry of the apparatus.

Example 26 includes subject matter (such as a method of operating a device, an electronic apparatus (e.g., circuit, electronic system, or both), or a machine) including receiving an analog signal, providing the analog signal through a loop filter of a sigma-delta modulator, providing feedback information from a quantizer included in the sigma-delta modulator to an internal node of a single-amplifier bi-quad (SAB) network included in the loop filter, and quantizing a signal generated by the loop filter based on the analog signal to provide a digital signal representing digital representation of the analog signal.

In Example 27, the subject matter of Example 26 may optionally include, wherein the feedback information is provided at an output node of the quantizer through a digital-to-analog converter to an input node of an amplifier in the SAB network.

In Example 28, the subject matter of Example 26 or 27 may optionally include, wherein providing the feedback information includes providing a current from a digital-to-analog converter on a feedback path to a resistor coupled between input and output nodes of an amplifier in the SAB network.

In Example 29, the subject matter of Example 28 may optionally include, wherein providing the feedback information includes providing a current from another digital-to-analog converter on the feedback path to the resistor.

Example 30 includes subject matter (such as a device, an electronic apparatus (e.g., circuit, electronic system, or both), or machine) including means for performing any of the methods of claims 26-29.

The subject matter of Example 1 through Example 30 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier, wherein the second stage includes a resistor coupled in series with the first and second capacitors between the input and output nodes of the amplifier.

2. An apparatus comprising:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier, wherein the feedback path includes an additional DAC, the additional DAC including an input node coupled to the output node of the quantizer and an output node coupled to a node between the first and second capacitors.

3. The apparatus of claim 2, wherein the feedback path includes another additional DAC coupled between the output node of the quantizer and the first stage.

4. An apparatus comprising:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier, wherein the feedback path includes an additional DAC, the additional DAC including an input node coupled to the output node of the quantizer and an output node coupled to the input node of the amplifier.

5. An apparatus comprising:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier, wherein the first capacitor is coupled between the second capacitor and the output node of the amplifier, and the first capacitor has a capacitance value greater than a capacitance value of the second capacitor.

6. An apparatus comprising:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier, wherein the first stage and the second stage are arranged in a loop filter of a sigma-delta modulator, and the second stage is arranged to create two poles within the loop filter.

7. An apparatus comprising:
a first stage including a first amplifier located in a loop filter path of a sigma-delta modulator;
a second stage coupled to the first stage, the second stage including a single amplifier bi-quad network, the single amplifier bi-quad network including a second amplifier and a capacitor coupled to an output node of the second amplifier;
a quantizer including an input node coupled to the output node of the second amplifier; and
a feedback path coupled to an output node of the quantizer and to the first and second stages.

8. The apparatus of claim 7, wherein the capacitor is a first capacitor, and the second stage includes a second capacitor, and a resistor coupled in series with the first and second capacitors between an input node of the second amplifier and the output node of the second amplifier.

9. The apparatus of claim 8, wherein the feedback path includes a digital-to-analog converter (DAC), the DAC including an input node coupled to the output node of the quantizer and an output node to the input node of the second amplifier.

10. The apparatus of claim 9, wherein the feedback path includes an additional DAC, the additional DAC including an input node coupled to the output node of the quantizer and an output node directly coupled to one of the first and second capacitors.

11. The apparatus of claim 7, wherein the quantizer includes a multi-bit resolution analog-to-digital converter.

12. The apparatus of claim 11, wherein the analog-to-digital converter includes a flash analog-to-digital converter.

13. An apparatus comprising:
a first stage including a first amplifier;
a second stage including a second amplifier, the second amplifier including an input node coupled to an output node of the first amplifier through a resistor;

a first capacitor and a second capacitor coupled in series between the input node and an output node of the second amplifier;
a quantizer coupled to the output node of the second amplifier;
a first digital-to-analog converter (DAC) coupled between an output node of the quantizer and the first stage;
a second DAC coupled between the output node of the quantizer and a node between the first and second capacitors; and
a third DAC coupled between the output node of the quantizer and the input node of the second amplifier.

14. The apparatus of claim 13, wherein the second stage includes an additional resistor coupled in series with the first and second capacitors between the input and output nodes of the second amplifier.

15. The apparatus of claim 14, wherein the additional resistor is a first additional resistor, and the second stage includes a second additional resistor coupled in parallel with a combination of the first additional resistor and the first and second capacitors between the input and output nodes of the second amplifier.

16. The apparatus of claim 15, wherein the second stage includes a third additional resistor coupled between the output node of the first amplifier and the first additional resistor.

17. The apparatus of claim 16, wherein the second stage includes a fourth resistor coupled between the first additional resistor and a common node.

18. The apparatus of claim 13, further comprising:
a fourth DAC coupled between the output node of the quantizer and a node between the first and second capacitors.

19. The apparatus of claim 13, further comprising:
a fourth DAC coupled between the output node of the quantizer and the input node of the second amplifier.

20. An apparatus comprising:
an antenna; and
a receiver coupled to the antenna, the receiver including
a sigma-delta modulator, the sigma-delta modulator including:
a first stage including an integrator;
a second stage coupled to the first stage, the second stage including an amplifier, a first capacitor, and a second capacitor coupled in series with the first capacitor between an input node and an output node of the amplifier;
a quantizer coupled to the output node of the amplifier; and
a feedback path coupled to an output node of the quantizer and to the first and second stages, the feedback path including a digital-to-analog converter (DAC), the DAC including an input node coupled to the output node of the quantizer and an output node coupled to the input node of the amplifier.

21. The apparatus of claim 20, wherein the second stage includes at least one resistor coupled in series with the first and second capacitors between the input node and the output node of the amplifier.

22. The apparatus of claim 20, wherein the feedback path includes at least one of a first additional DAC including an input node coupled to the output node of the quantizer and an output node coupled to a node between the first and second capacitors, and a second additional DAC including an input node coupled to the output node of the quantizer and an output node coupled to the input node of the amplifier.

23. The apparatus of claim 20, wherein the receiver is included in a front-end module circuitry of the apparatus.

\* \* \* \* \*